(12) United States Patent
Kim et al.

(10) Patent No.: US 11,149,201 B2
(45) Date of Patent: Oct. 19, 2021

(54) SILICON NITRIDE LAYER ETCHING COMPOSITION

(71) Applicant: ENF TECHNOLOGY CO., LTD., Yongin-si (KR)

(72) Inventors: Dong Hyun Kim, Yongin-si (KR); Hyeon Woo Park, Yongin-si (KR); Du Won Lee, Yongin-si (KR); Jang Woo Cho, Suwon-si (KR); Myung Ho Lee, Hwaseong-si (KR); Myung Geun Song, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 0 days.

(21) Appl. No.: 16/416,089

(22) Filed: May 17, 2019

(65) Prior Publication Data
US 2019/0390110 A1  Dec. 26, 2019

(30) Foreign Application Priority Data

Jun. 25, 2018  (KR) .......................... 10-2018-0072689

(51) Int. Cl.
*C09K 13/06* (2006.01)
*H01L 21/311* (2006.01)
*C09K 13/08* (2006.01)

(52) U.S. Cl.
CPC .............. *C09K 13/06* (2013.01); *C09K 13/08* (2013.01); *H01L 21/31111* (2013.01)

(58) Field of Classification Search
CPC .... C09K 13/06; C09K 13/08; H01L 21/31111
See application file for complete search history.

(56) References Cited

U.S. PATENT DOCUMENTS

2015/0348799 A1\* 12/2015 Hong ................... C09K 13/04
438/268

FOREIGN PATENT DOCUMENTS

| CN | 107573940 A | 1/2018 |
|---|---|---|
| KR | 10-2013-0042273 A | 4/2013 |
| KR | 10-2014-0079267 A | 6/2014 |
| KR | 10-2017-0093430 A | 8/2017 |
| KR | 10-2017-0134899 A | 12/2017 |
| KR | 10-1828437 B1 | 3/2018 |

OTHER PUBLICATIONS

Office Action of Chinese Patent Application No. 201910520688.9—9 pages (Jun. 2, 2021).
Office Action of Korean Patent Application No. 10-2018-0072689—8 pages (Mar. 10, 2021).

\* cited by examiner

*Primary Examiner* — Nadine G Norton
*Assistant Examiner* — Mahmoud Dahimene
(74) *Attorney, Agent, or Firm* — Knobbe Martens Olson & Bear LLP

(57) ABSTRACT

Provided is a silicon nitride layer etching composition, and more specifically, a silicon nitride layer etching composition including two different silicon-based compounds in an etching composition to be capable of selectively etching a silicon nitride layer relative to a silicon oxide layer with a remarkable etch selectivity ratio and providing remarkable effects of suppressing generation of precipitates and reducing the abnormal growth of other layers existing in the vicinity, including the silicon oxide layer when the silicon nitride layer etching composition is used for an etching process and a semiconductor manufacturing process.

8 Claims, No Drawings

SILICON NITRIDE LAYER ETCHING COMPOSITION

CROSS-REFERENCE TO RELATED APPLICATIONS

This application claims priority under 35 U.S.C. § 119 to Korean Patent Application No. 10-2018-0072689, filed on Jun. 25, 2018, in the Korean Intellectual Property Office, the disclosure of which is incorporated herein by reference in its entirety.

TECHNICAL FIELD

The following disclosure relates to a silicon nitride layer etching composition, a method of etching a silicon nitride layer using the same, a method of suppressing abnormal growth of a silicon oxide layer, and a method of manufacturing a semiconductor device.

BACKGROUND

A silicon oxide layer ($SiO_2$) and a silicon nitride layer ($SiN_x$) are typical insulating layers used in a semiconductor manufacturing process. Among them, the silicon nitride layer is used as a cap layer, a spacer layer, or a hard mask layer in a semiconductor device. The silicon oxide layer and the silicon nitride layer may be used alone or one or more silicon oxide layers and one or more silicon nitride layers may be alternately stacked to be used. When manufacturing semiconductors, the silicon nitride layers and silicon oxide layers are etched.

SUMMARY

An embodiment of the present invention is directed to to an etching composition for a silicon nitride layer including two different silicon-based compounds in an etching composition to be capable of etching a silicon nitride layer with a high selectivity ratio relative to a silicon oxide layer, and more specifically, providing a silicon nitride layer etching composition including a phosphoric acid, two different silicon-based compounds, and water to have a high etch selectivity ratio with respect to a silicon nitride layer.

Another embodiment of the present invention is directed to providing a stable silicon nitride layer etching composition in which a change in etch rate and a change in etch selectivity ratio are small with respect to a silicon nitride layer even when an etching treatment time increases or the etching composition is repeatedly used.

Still another embodiment of the present invention is directed to providing a silicon nitride layer etching composition that does not generate precipitation and does not cause abnormal growth of a silicon oxide layer when etching proceeds.

Still another embodiment of the present invention is directed to providing a method of etching a silicon nitride layer and a method of manufacturing a semiconductor device, using the silicon nitride layer etching composition.

Still another embodiment of the present invention is directed to providing a method of suppressing abnormal growth of a silicon oxide layer using the silicon nitride layer etching composition.

In one general aspect, a silicon nitride layer etching composition includes:

a phosphoric acid, a first silicon-based compound represented by Chemical Formula 1 below, a second silicon-based compound represented by Chemical Formula 2 below, and water:

[Chemical Formula 1]

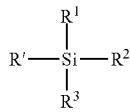

[Chemical Formula 2]

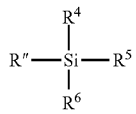

in Chemical Formulas 1 and 2, $R^1$ to $R^6$ are each independently selected from hydrogen, a halogen, hydroxy, (C1-C10)alkoxy, (C1-C10)alkyl, and (C2-C10)alkenyl;

R' is substituted or unsubstituted amino(C1-C10)alkyl, —$CH_2$— of the alkyl may be substituted with —N($R^{11}$)— or —O—, and $R^{11}$ is hydrogen, (C1-C10)alkyl, or amino(C1-C10)alkyl;

R" is selected from substituted or unsubstituted -$L_1$-$SO_3H$, -$L_2$-OP(=O) $(OH)_2$, -$L_3$-P(=O) $(OR^{12})$ $(OR^{13})$, -$L_4$-OP(=O) (OH) ($R^{14}$), -$L_5$-P(=O) $(OR^{15})$ $R^{16}$, and a salt thereof, wherein $L_1$ to $L_5$ are each independently (C1-C10)alkylene or (C3-C10)cycloalkylene, and $R^{12}$ to $R^{16}$ are each independently hydrogen or (C1-C10)alkyl; and the substitution includes one or more selected from halogen, hydroxy, cyano, nitro, (C1-C10)alkyl, (C1-C10)alkoxy, (C3-C10)cycloalkyl, (C3-C10)heterocycloalkyl, (C3-C12) heteroaryl, and (C6-C12)aryl, wherein the heterocycloalkyl or the heteroaryl includes one or more selected from B, N, O, S, P(=O), Si, and P.

In Chemical Formulas 1 and 2, $R^1$ to $R^6$ may be each independently selected from a halogen, hydroxy, (C1-C7) alkoxy, (C1-C7)alkyl, and (C2-C7)alkenyl, and at least any one substituent of $R^1$ to $R^3$ and at least any one substituent of $R^4$ to $R^6$ may be hydroxy or (C1-C7)alkoxy; R' may be -$L_{11}$-(A-$L_{12}$)$_a$-$NR^{21}R^{22}$, wherein $L_{11}$ and $L_{12}$ may be each independently (C1-C7)alkylene, $R^{21}$ and $R^{22}$ may be each independently hydrogen, (C1-C7)alkyl, or amino(C1-C7) alkyl, A may be —N($R^{11}$)— or —O—, $R^{11}$ may be hydrogen, (C1-C7)alkyl or amino(C1-C7)alkyl, a may be an integer from 0 to 6, and each structural unit may be different from each other when a is an integer of 2 or more; and R" may be selected from —Li—$SO_3H$, -$L_2$-OP(=O) $(OH)_2$, -$L_3$-P(=O) $(OR^{12})$ $(OR^{13})$, -$L_4$-OP(=O) (OH) ($R^{14}$), -$L_5$-P(=O) $(OR^{15})R^{16}$, and a salt thereof, wherein Li to $L_5$ may be each independently (C1-C7)alkylene or (C3-C7)cycloalkylene, and $R^{12}$ to $R^{16}$ may be each independently hydrogen or (C1-C7)alkyl.

In Chemical Formulas 1 and 2, $R^1$ to $R^6$ may be each independently hydroxy or (C1-C7)alkoxy; R' may be -$L_{11}$-$NR^{21}R^{22}$, wherein $L_{11}$ may be (C1-C7)alkylene, and $R^{21}$ and $R^{22}$ may be each independently hydrogen or (C1-C7)alkyl; and R" may be selected from -$L_1$-$SO_3H$, -$L_2$-OP(=O) $(OH)_2$, -$L_3$-P(=O) $(OR^{12})$ $(OR^{13})$, -$L_4$-OP(=O) (OH) ($R^{14}$), -$L_5$-P(=O) $(OR^{15})R^{16}$, and a salt thereof, wherein $L_1$ to $L_5$ may be each independently (C1-C7)alkylene or (C3-C7)cycloalkylene, and $R^{12}$ to $R^{16}$ may be each independently hydrogen or (C1-C7)alkyl.

In Chemical Formulas 1 and 2, $R^1$ to $R^6$ may be each independently hydroxy or (C1-C7)alkoxy; R' may be -$L_{11}$-(N($R^{11}$)-$L_{12}$)$_a$-N$R^{21}R^{22}$, wherein $L_{11}$ and $L_{12}$ may be each independently (C1-C7)alkylene, $R^{21}$ and $R^{22}$ may be each independently hydrogen or (C1-C7)alkyl, $R^1$ may be hydrogen, (C1-C7)alkyl, and a may be an integer from 1 to 3; and R" may be selected from —Li—SO$_3$H, -$L_2$-OP(=O) (OH)$_2$, -$L_3$-P(=O) (O$R^{12}$) (O$R^{13}$), -$L_4$-OP(=O) (OH) ($R^{14}$), -$L_5$-P(=O) (O$R^{15}$)$R^{16}$, and a salt thereof, wherein $L_1$ to $L_5$ may be each independently (C1-C7)alkylene or (C3-C7)cycloalkylene, and $R^{12}$ to $R^{16}$ may be each independently hydrogen or (C1-C7)alkyl.

The silicon nitride layer etching composition may include at least one first silicon-based compound selected from compounds represented by Chemical Formulas 3 to 5 below:

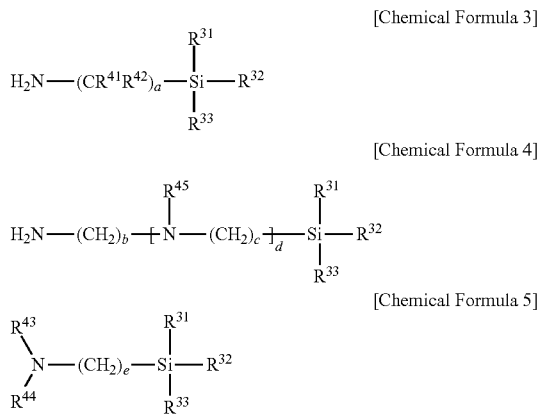

[Chemical Formula 3]

[Chemical Formula 4]

[Chemical Formula 5]

in Chemical Formulas 3 to 5, $R^{31}$ to $R^{33}$ are each independently hydroxy or (C1-C3)alkoxy;

$R^{41}$, $R^{42}$, $R^{44}$ and $R^{45}$ are each independently hydrogen or (C1-C3)alkyl;

$R^{43}$ is (C1-C3)alkyl;

a, d, and e are each independently an integer from 1 to 5; and c and b are each independently an integer from 2 to 4.

The silicon nitride layer etching composition may include at least one second silicon-based compound selected from a compound represented by Chemical Formula 6 below:

[Chemical Formula 6]

in Chemical Formula 6, $R^{34}$ to $R^{36}$ are each independently hydroxy or (C1-C3)alkoxy;

R" is selected from -$L_1$-SO$_3$H, -$L_2$-OP(=O) (OH)$_2$, -$L_3$-P(=O) (O$R^{12}$) (O$R^{13}$), -$L_4$-OP(=O) (OH) ($R^{14}$), -$L_5$-P(=O) (O$R^{15}$) $R^{16}$, and a salt thereof, wherein $L_1$ to $L_5$ are each independently (C1-C7)alkylene, and $R^{12}$ to $R^{16}$ are each independently hydrogen or (C1-C3)alkyl; and f is an integer from 1 to 5.

A molar ratio (R':R") of the substituents R' and R" of the first silicon-based compound and the second silicon-based compound may be 1:0.01 to 1:1.

The silicon nitride layer etching composition may include 60 to 95 wt % of the phosphoric acid; 0.01 to 10 wt % of the total of the first silicon-based compound and the second silicon-based compound; and a remaining amount of water, based on the total weight of the silicon nitride layer etching composition.

The silicon nitride layer etching composition may include the first silicon-based compound and the second silicon-based compound in a weight ratio of 1:1 to 100:1.

The silicon nitride layer etching composition may further include a fluorine-based compound.

An etch rate with respect to the silicon nitride layer of a silicon nitride layer etching composition may be 100 to 300 Å/min, and an etch rate with respect to the silicon oxide layer of the silicon nitride layer etching composition may be 0 to 0.2 Å/min.

A silicon nitride layer/silicon oxide layer etch selectivity ratio of the silicon nitride layer etching composition may be 500 or more.

An etch rate drift of a silicon nitride layer after repeating an etching process may satisfy Relational Expression 1 below:

$$\Delta ERD_{SiNx} \leq 1\%$$ [Relational Expression 1]

in Relational Expression 1, $\Delta ERD_{SiNx}$ is an etch rate drift relative to an initial etch rate with respect to the silicon nitride layer.

In another general aspect, there is provided a method of selectively etching a silicon nitride layer relative to a silicon oxide layer using the silicon nitride layer etching composition described above.

In still another general aspect, there is provided a method of suppressing abnormal growth of a silicon oxide layer using the silicon nitride layer etching composition described above.

In still another general aspect, there is provided a method of manufacturing a semiconductor device including: an etching process performed using the silicon nitride layer etching composition described above.

DETAILED DESCRIPTION OF EMBODIMENTS

Hereinafter, embodiments and examples of the present invention are discussed in more detail. It should be understood, however, that the following embodiments or Examples are only illustrative of the present invention in detail, and the present invention is not limited thereto and may be implemented in various forms.

In addition, unless defined otherwise, all technical and scientific terms used herein have the same meanings as commonly understood by those skilled in the art to which the present disclosure pertains. Terms used herein have purposes of effectively describing particular embodiments only and are not intended to limit the present invention.

Further, singular forms used in the specification and the appended claims are intended to include plural forms as well, unless otherwise specified in the context.

Silicon nitride layers may be etched using a mixture of high-purity phosphoric acid and deionized water at a high temperature of about 160° C. However, when using the high-purity phosphoric acid, an etch selectivity ratio of silicon nitride layers with respect to silicon oxide layers is reduced, and thus it is difficult to apply the high-purity phosphoric acid to a structure in which silicon nitride layers and silicon oxide layers are stacked. In addition, since a silicon nitride layer etching composition containing a phosphoric acid is continuously concentrated at a high temperature by evaporation of water to affect an etch rate of the nitride layer and the oxide layer, it is required to continuously supply deionized water. However, even when an amount of deionized water to be supplied is slightly changed, defects may be caused in removal of the silicon nitride layer, and the phosphoric acid itself is a strong acid and corrosive, which makes it difficult to handle.

In order to improve the etch selectivity ratio of the silicon nitride layer with respect to the silicon oxide layer, a silicon nitride layer etching composition in which a silicic acid is dissolved in a phosphoric acid may be used. However, when using the foregoing silicon nitride layer etching composition, there may be precipitates that are generated and abnormal growth in which a thickness of the silicon oxide layer rather increases when etching proceeds, which makes it difficult to apply the silicon nitride layer etching composition to a process.

In addition, a method of controlling an etch selectivity ratio by using a silicon compound containing an oxygen atom directly bonded to silicon may be used. However, the etch selectivity ratio of the silicon nitride layer relative to the silicon oxide layer is not high, and a silicic acid generated by etching the silicon nitride layer may still cause abnormal growth, causing various issues in a post-process.

The term "etch selectivity ratio ($E_{SiNx}/E_{SiO2}$)" as used herein means a ratio of a silicon nitride layer etch rate ($E_{SiNx}$) relative to a silicon oxide layer etch rate ($E_{SiO2}$). Further, a case where the silicon oxide layer etch rate is close to zero or a case where the etch selectivity ratio is large means that the silicon nitride layer is capable of being selectively etched.

The term "change in etch selectivity ratio" as used herein means an absolute value of a difference in the etch selectivity ratio relative to the initial etch selectivity ratio when the etching process is repeated two or more times using the same silicon nitride layer etching composition.

The term "etch rate drift (ΔERD)" as used herein means a change rate of the etch rate relative to the initial etch rate when the etching process is repeated twice or more using the same silicon nitride layer etching composition. In general, as the etching process is repeated, an etch performance, i.e., an etch rate, tends to decrease, and thus the drift is defined as a reduction rate, and the change rate is also interpreted in the same sense. Specifically, the etch rate drift may be derived from Equation 1 below:

$$\Delta ERD(\%) = [1 - \{(\text{etch rate when etching process is repeated } n \text{ times or more})/(\text{initial etch rate})\}] \times 100.$$ [Equation 1]

Unless specifically stated otherwise, the units used are based on weight. For example, the unit of percentage (%) or the unit of the ratio means the wt % or the weight ratio, wherein the wt % means the weight percentage of any one component accounted for in the total of composition, unless otherwise defined.

"Alkyl" and "alkoxy" as used herein include both linear and branched forms.

"Alkylene" as used herein means a divalent substituent in which one hydrogen is removed from the above-described alkyl.

"Alkenyl" as used herein refers to a monovalent substituent derived from a linear or branched hydrocarbon including one or more double bonds.

"Aminoalkyl" as used herein means *-(alkylene)-$NH_2$.

"Cycloalkyl" as used herein refers to a non-aromatic monocyclic or multicyclic ring system having 3 to 30 carbon atoms, wherein the monocyclic ring includes cyclopropyl, cyclobutyl, cyclopentyl, and cyclohexyl without limitation. Examples of the multicyclic cycloalkyl group may include perhydronaphthyl, perhydroindenyl, and the like; and a bridged multicyclic cycloalkyl group includes adamantyl, norbornyl, and the like.

"Cycloalkylene" as used herein means a divalent substituent in which one hydrogen is removed from the above-described cycloalkyl.

Further, "heterocycloalkyl" as used herein refers to a substituted or unsubstituted and non-aromatic 3 to 15-membered ring system substituent including carbon atoms and from 1 to 5 heteroatoms selected from nitrogen, phosphorus, oxygen, and sulfur, and the like, wherein a heterocycloalkyl radical may be a monocyclic, bicyclic, or tricyclic ring system that may be fused or bridged, or may include a spiro ring system, and nitrogen, phosphorus, carbon, oxygen, or sulfur atoms in the heterocycloalkyl radical may be optionally oxidized to various oxidation states. In addition, the nitrogen atom may optionally be quaternized.

"Aryl" as used herein, which is a substituent in which one hydrogen is removed from an aromatic hydrocarbon by one hydrogen removal, includes a single or fused ring system suitably including 4 to 7 ring atoms, and preferably, 5 or 6 ring atoms in each ring, and even includes a form in which a plurality of aryls are linked to each other by a single bond. Specific examples of the aryl may include phenyl, naphthyl, biphenyl, anthryl, indenyl, fluorenyl, and the like, but the present invention is not limited thereto.

"Heteroaryl" as used herein means an aryl group including 1 to 4 heteroatoms selected from B, N, O, S, P(=O), Si, and P, and the like, as an aromatic ring framework atom and carbon as the remaining aromatic ring framework atom, is a 5- to 6-membered monocyclic heteroaryl and a multicyclic heteroaryl condensed with one or more benzene rings, and may be partially saturated. In addition, the heteroaryl in embodiments of the present invention even includes a form in which one or more heteroaryls are linked by a single bond.

"Halogen" as used herein means a fluorine atom, a chlorine atom, a bromine atom, an iodine atom, or the like.

The silicon nitride layer and the silicon oxide layer are typical insulating layers used in a semiconductor manufacturing process. In the semiconductor process, the silicon nitride layer is in contact with a silicon oxide layer, a polysilicon layer and a silicon wafer surface, and the like, and is deposited mainly by a chemical vapor deposition (CVD) process, which is removed by etching.

In a typical wet etching, the etch selectivity ratio of the silicon nitride layer with respect to the silicon oxide layer is lowered, and an etch selection property is changed when an etching solution is used several times. Further, precipitates are generated and a thickness of the silicon oxide layer increases when the etching proceeds.

Accordingly, the present inventors conducted intensive research on a silicon nitride layer etching composition for improving etch selectivity ratio. As a result, the present inventors found that when the silicon nitride layer was treated with a composition including a phosphoric acid and two different silicon-based compounds, the etch selectivity ratio with respect to the silicon nitride layer relative to the silicon oxide layer was excellent and the abnormal growth was reduced.

Further, the present inventors found that the silicon nitride layer etching composition according to embodiments of the present invention exhibited excellent etch selection property with respect to the silicon nitride layer relative to the silicon oxide layer, and exhibited high stability, and thus the etch rate and the etch selectivity ratio with respect to the silicon nitride layer were maintained for a long period of time even when an etching treatment time and the number of treatment times increased.

Hereinafter, a silicon nitride layer etching composition according to embodiments of the present invention is described in detail.

The silicon nitride layer etching composition according to an embodiment of the present invention may include a phosphoric acid, a first silicon-based compound represented by Chemical Formula 1 below, a second silicon-based compound represented by Chemical Formula 2 below, and water:

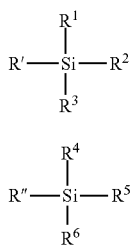

[Chemical Formula 1]

[Chemical Formula 2]

in Chemical Formulas 1 and 2, $R^1$ to $R^6$ are each independently selected from hydrogen, a halogen, hydroxy, (C1-C10)alkoxy, (C1-C10)alkyl, and (C2-C10)alkenyl;

R' is substituted or unsubstituted amino (C1-C10)alkyl, —$CH_2$— of the alkyl may be substituted with —$N(R^{11})$— or —O—, and $R^{11}$ is hydrogen, (C1-C10)alkyl, or amino (C1-C10)alkyl;

R" is selected from substituted or unsubstituted -$L_1$-$SO_3H$, -$L_2$-OP(=O) (OH)$_2$, -$L_3$-P(=O) (OR$^{12}$) (OR$^{13}$), -$L_4$-OP(=O) (OH) (R$^{14}$), -$L_5$-P(=O) (OR$^{15}$) R$^{16}$, and a salt thereof, wherein $L_1$ to $L_5$ are each independently (C1-C10)alkylene or (C3-C10)cycloalkylene, and $R^{12}$ to $R^{16}$ are each independently hydrogen or (C1-C10)alkyl; and the substitution includes one or more selected from a halogen, hydroxy, cyano, nitro, (C1-C10)alkyl, (C1-C10)alkoxy, (C3-C10)cycloalkyl, (C3-C10)heterocycloalkyl, (C3-C12)heteroaryl, and (C6-C12)aryl, wherein the heterocycloalkyl or the heteroaryl includes one or more selected from B, N, O, S, P(=O), Si, and P.

In the first silicon-based compound represented by Chemical Formula 1, $R^1$ to $R^3$ may be each independently selected from a halogen, hydroxy, (C1-C7)alkoxy, (C1-C7)alkyl, and (C2-C7)alkenyl, and at least any one substituent of $R^1$ to $R^3$ may be hydroxy or (C1-C7)alkoxy; R' may be -$L_1$-(A-$L_{12}$)$_a$-NR$^{21}$R$^{22}$, wherein $L_{11}$ and $L_{12}$ may be each independently (C1-C7)alkylene, $R^{21}$ and $R^{22}$ may be each independently hydrogen, (C1-C7)alkyl or amino(C1-C7)alkyl, A may be —$N(R^{11})$— or —O—, $R^{11}$ may be hydrogen, (C1-C7)alkyl, or amino(C1-C7)alkyl, a may be an integer from 0 to 6, and each structural unit may be different from each other when a is an integer of 2 or more.

In the first silicon-based compound represented by Chemical Formula 1, $R^1$ to $R^3$ may be each independently hydroxy or (C1-C7)alkoxy; and R' may be -$L_{11}$-NR$^{21}$R$^{22}$, wherein $L_{11}$ may be (C1-C7)alkylene, and $R^{21}$ and $R^{22}$ may be each independently hydrogen or (C1-C7)alkyl.

In the first silicon-based compound represented by Chemical Formula 1, $R^1$ to $R^3$ may be each independently hydroxy or (C1-C7)alkoxy; R' may be -$L_{11}$-(N(R$^{11}$)-$L_{12}$)$_a$-NR$^{21}$R$^{22}$, wherein $L_{11}$ and $L_{12}$ may be each independently (C1-C7)alkylene, and $R^{21}$ and $R^{22}$ may be each independently hydrogen or (C1-C7)alkyl, and $R^{11}$ may be hydrogen, (C1-C7)alkyl, and a may be an integer from 1 to 3.

Specifically, the first silicon-based compound may be at least one selected from compounds represented by Chemical Formulas 3 to 5 below:

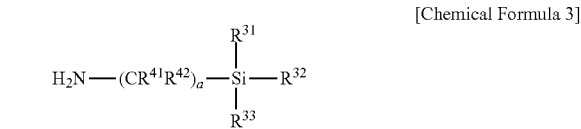

[Chemical Formula 3]

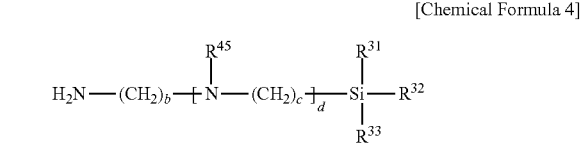

[Chemical Formula 4]

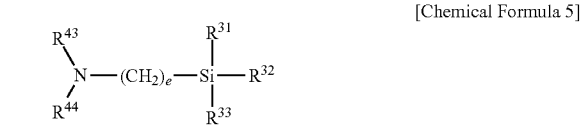

[Chemical Formula 5]

in Chemical Formulas 3 to 5, $R^{31}$ to $R^{33}$ are each independently hydroxy or (C1-C3) alkoxy;

$R^{41}$, $R^{42}$, $R^{44}$ and $R^{45}$ are each independently hydrogen or (C1-C3)alkyl;

$R^{43}$ is (C1-C3)alkyl;

a, d, and e are each independently an integer from 1 to 5; and c and b are each independently an integer from 2 to 4.

More specifically, the first silicon-based compound may be selected from the group consisting of (3-aminopropyl) silanetriol, N-(2-aminoethyl)-(3-aminopropyl)trimethoxysilane, (3-trimethoxysilylpropyl) diethylenetriamine, 4-amino-3,3-dimethylbutyltrimethoxysilane, (N,N-dimethyl-3-aminopropyl)trimethoxysilane, and the like.

In the second silicon-based compound represented by Chemical Formula 2, $R^4$ to $R^6$ may be each independently selected from a halogen, hydroxy, (C1-C7)alkoxy, (C1-C7) alkyl, and (C2-C7)alkenyl, and at least any one substituent of $R^4$ to $R^6$ may be hydroxy or (C1-C7)alkoxy; and R" may be selected from -$L_1$-$SO_3H$, -$L_2$-OP(=O) (OH) 2, -$L_3$-P (=O) (OR$^{12}$) (OR$^{13}$), -$L_4$-OP(=O) (OH) (R$^{14}$), -$L_5$-P(=O) (OR$^{15}$)R$^{16}$, and a salt thereof, wherein $L_1$ to $L_5$ may be each independently (C1-C7)alkylene or (C3-C7)cycloalkylene, and $R^{12}$ to $R^{16}$ may be each independently hydrogen or (C1-C10)alkyl.

The salt may be an alkali metal such as sodium, potassium, or the like, but is not limited as long as the salt is commonly used in the art.

In the second silicon-based compound represented by Chemical Formula 2, $R^4$ to $R^6$ may be each independently hydroxy or (C1-C7)alkoxy; and R" may be selected from -$L_1$-$SO_3H$, -$L_2$-OP(=O) (OH)$_2$, -$L_3$-P(=O) (OR$^{12}$) (OR$^{13}$), -$L_4$-OP(=O) (OH) (R$^{14}$), -$L_5$-P(=O) (OR$^{15}$)R$^{16}$, and a salt thereof, wherein $L_1$ to $L_5$ may be each independently (C1-C7)alkylene or (C3-C7)cycloalkylene, and $R^{12}$ to $R^{16}$ may be each independently hydrogen or (C1-C7)alkyl.

Specifically, the second silicon-based compound may be at least one selected from a compound represented by Chemical Formula 6 below:

[Chemical Formula 6]

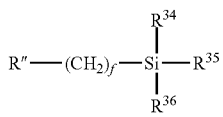

in Chemical Formula 6, $R^{34}$ to $R^{36}$ are each independently hydroxy or (C1-C3) alkoxy;

R" is selected from -$L_1$-$SO_3H$, -$L_2$-OP(=O) $(OH)_2$, -$L_3$-P(=O) $(OR^{12})$ $(OR^{13})$, -$L_4$-OP(=O) (OH) ($R^{14}$), -$L_5$-P(=O) $(OR^{15})$ $R^{16}$, and a salt thereof, wherein $L_1$ to $L_5$ are each independently (C1-C7)alkylene, and $R^{12}$ to $R^{16}$ are each independently hydrogen or (C1-C3)alkyl; and f is an integer from 1 to 5.

More specifically, the second silicon-based compound may be selected from 3-(trihydroxysilyl)-1-propanesulfonic acid, 3-(trihydroxysilyl)propyl methylphosphonate monosodium salt, diethylphosphatoethyltriethoxysilane, [2-(trihydroxysilyl)ethyl]phosphonic acid, and the like.

In the silicon nitride layer etching composition according to an embodiment of the present invention, a cationic group of the first silicon-based compound may be included at a high molar ratio relative to an anionic group of the second silicon-based compound in order to have excellent silicon nitride layer/silicon oxide layer etch selectivity ratio and to effectively suppress precipitates and abnormal growth that are generated during the etching process.

For example, the molar ratio between the cationic group of the first silicon-based compound and the anionic group of the second silicon-based compound may be 1:0.01 to 1:1, specifically 1:0.05 to 1:1, and more specifically, 1:0.1 to 1:1.

Further, the silicon nitride layer etching composition according to an embodiment of the present invention may include 60 to 95 wt % of the phosphoric acid; 0.01 to 10 wt % of the total of the first silicon-based compound and the second silicon-based compound; and a remaining amount of water, based on the total weight of the silicon nitride layer etching composition.

From the viewpoint in which the generation of precipitates is remarkably reduced, the abnormal growth of the silicon oxide layer and the like other than the silicon nitride layer is more effectively prevented, and the etching composition has excellent stability during a high temperature semiconductor etching process, thereby having a small change in etch rate and in etch selectivity ratio. Specifically, the silicon nitride layer etching composition may include 60 to 90 wt % of the phosphoric acid; 0.05 to 10 wt % of the total of the first silicon-based compound and the second silicon-based compound; and a remaining amount of water, and more specifically, may include 75 to 90 wt % of the phosphoric acid; 0.05 to 5 wt % of the total of the first silicon-based compound and the second silicon-based compound; and a remaining amount of water.

In an embodiment, when the silicon nitride layer etching composition satisfying the above-described range is used in the etching process, it is preferable since it is possible to etch the silicon nitride layer with high etch selection property, to maintain excellent etch rate and high etch selection property with respect to the silicon nitride layer even after repeating the etching process, and there is no disadvantage in the etching process.

From the viewpoint of providing a remarkable effect to the above-described effect, specifically, in the silicon nitride layer etching composition, the first silicon-based compound (a) may be used in an excessive amount as compared to that of the second silicon-based compound (b).

For example, the silicon nitride layer etching composition may include the first silicon-based compound (a) and the second silicon-based compound (b) in a weight ratio (a:b) of 1:1 to 100:1.

For example, the weight ratio (a:b) may be 1:1 to 70:1.

For example, the weight ratio (a:b) may be 1:1 to 50:1.

Further, the silicon nitride layer etching composition according to an embodiment of the present invention may further include a fluorine-based compound.

When the fluorine-based compound is added, the etch rate of the silicon nitride layer may increase. Even when the fluorine-based compound is repeatedly used, the change in etch rate and the change in etch selectivity ratio with respect to the silicon nitride layer may be small.

The fluorine-based compound may be one or a mixture of two or more selected from the group consisting of hydrogen fluoride, ammonium fluoride, ammonium bifluoride, and tetrafluoroboric acid, and the like.

For example, the fluorine-based compound may be included in an amount of 0.001 to 2 wt %, specifically 0.005 to 1 wt %, and more specifically 0.01 to 0.1 wt %, based on the total weight of the silicon nitride layer etching composition.

Further, the silicon nitride layer etching composition according to an embodiment of the present invention may further include an alcoholic solvent. Therefore, it is possible to obtain a stable effect even at a high temperature of a semiconductor manufacturing process by controlling a viscosity of the silicon nitride layer etching composition. Further, even when the silicon nitride layer etching composition is used several times, the change rate of the etch rate with respect to the silicon nitride layer is low, and thus the process efficiency is good.

The alcoholic solvent may be one or a mixture of two or more selected from the group consisting of methanol, ethanol, propanol, isopropanol, butanol, isobutanol, t-butanol, pentanol, hexanol, heptanol, octanol, and tetrahydrofurfuryl alcohol (THFA).

For example, the alcoholic solvent may be included in an amount of 0.05 to 10 wt %, specifically 0.05 to 5 wt %, and more specifically 0.05 to 3 wt %, based on the total weight of the silicon nitride layer etching composition.

The water is not particularly limited but may be specifically deionized water. More specifically, the deionized water is a deionized water for a semiconductor process and may have a specific resistance value of 18 MΩ·cm or more.

Further, the silicon nitride layer etching composition according to an embodiment of the present invention may further include an additive. The additive may include any one or two or more selected from a surfactant, an antioxidant, a corrosion inhibitor, and the like, and various additives may be used in addition to the above-described additives, although the invention is not limited thereto.

For example, the additive may be used, respectively, in an amount of 0.01 to 2 wt % based on the total weight of the silicon nitride layer etching composition, but the amount of the additive is not limited thereto.

The silicon nitride layer etching composition according to an embodiment of the present invention has a remarkable etch rate with respect to the silicon nitride layer and an excellent etch selectivity ratio with respect to the silicon nitride layer relative to the silicon oxide layer.

For example, in the silicon nitride layer etching composition, an etch rate with respect to the silicon nitride layer may be 100 to 300 Å/min, and an etch rate with respect to the silicon oxide layer may be 0 to 0.2 Å/min.

For example, in the silicon nitride layer etching composition, the etch rate with respect to the silicon nitride layer may be 130 to 300 Å/min, and the etch rate with respect to the silicon oxide layer may be 0 to 0.15 Å/min.

For example, in the silicon nitride layer etching composition, the etch rate with respect to the silicon nitride layer may be 150 to 250 Å/min, and the etch rate with respect to the silicon oxide layer may be 0.05 to 0.1 Å/min.

For example, in the silicon nitride layer etching composition, the etch rate with respect to the silicon nitride layer may be 150 to 180 Å/min, and the etch rate with respect to the silicon oxide layer may be 0.05 to 0.1 Å/min.

For example, the silicon nitride layer etching composition may have a silicon nitride layer/silicon oxide layer etch selectivity ratio ($E_{SiNx}/E_{SiO2}$) of 500 or more.

For example, the silicon nitride layer etching composition may have a silicon nitride layer/silicon oxide layer etch selectivity ratio ($E_{SiNx}/E_{SiO2}$) of 1,000 to 5,000.

For example, the silicon nitride layer etching composition may have a silicon nitride layer/silicon oxide layer etch selectivity ratio ($E_{SiNx}/E_{SiO2}$) of 1,500 to 3,500.

Further, in the silicon nitride layer etching composition according to an embodiment of the present invention, an etch rate drift of the silicon nitride layer after repeating an etching process may satisfy Relational Expression 1 below:

$$\Delta ERD_{SiNx} \leq 1\%$$  [Relational Expression 1]

in Relational Expression 1, $\Delta ERD_{SiNx}$ is an etch rate drift relative to an initial etch rate with respect to the silicon nitride layer.

The silicon nitride layer etching composition may have excellent stability to have a stable effect even at a high temperature of a semiconductor manufacturing process. Further, even when the silicon nitride layer etching composition is used several times, the change rate of the etch rate with respect to the silicon nitride layer is low, and thus the process efficiency is good.

For example, the etch rate drift ($\Delta ERD_{SiNx}$) of the silicon nitride layer may be 0.01 to 0.95%.

For example, the etch rate drift ($\Delta ERD_{SiNx}$) of the silicon nitride layer may be 0.1 to 0.9%.

Hereinafter, a method of using the silicon nitride layer etching composition according to embodiments of the present invention is described in detail.

An aspect of the method according to an embodiment of the present invention may be a method of selectively etching the silicon nitride layer relative to the silicon oxide layer.

Another aspect may be a method of suppressing abnormal growth of the silicon oxide layer.

Still another aspect may be a method of manufacturing a semiconductor device including an etching process in which the silicon nitride layer is selectively etched.

The silicon nitride layer may be various silicon nitride layers such as a SiN layer, a SiON layer, and a doped SiN layer, and the like. As a specific example with a concept including the silicon nitride layer, the silicon nitride layer may be a layer quality which is mainly used as an insulating layer when forming a gate electrode or the like. However, the silicon nitride layer may be used without limitation as long as the silicon nitride layer is used in a technical field having a purpose of selectively etching the silicon nitride layer relative to the silicon oxide layer.

Further, the silicon oxide layer is not limited as long as the silicon oxide layer is a silicon oxide layer commonly used in the art. For example, the silicon oxide layer may be at least one layer selected from the group consisting of a spin on dielectric (SOD) layer, a high density plasma (HDP) layer, a thermal oxide layer, a borophosphate silicate glass (BPSG) layer, a phospho silicate glass (PSG) layer, a boro silicate glass (BSG) layer, a polysilazane (PSZ) layer, a fluorinated silicate glass (FSG) layer, a low pressure tetra ethyl ortho silicate (LP-TEOS) layer, a plasma enhanced tetra ethyl ortho silicate (PETEOS) layer, a high temperature oxide (HTO) layer, a medium temperature oxide (MTO) layer, an undoped silicate glass (USG) layer, a spin on glass (SOG) layer, an advanced planarization layer (APL), an atomic layer deposition (ALD) layer, a plasma enhanced oxide (PE-oxide) layer, and $O_3$-tetra ethyl ortho silicate ($O_3$-TEOS), and the like. However, this is merely a specific example, and the present invention is not limited thereto.

In the etching method using the silicon nitride layer etching composition according to an embodiment of the present invention and the method of manufacturing a semiconductor device including the same, when the above-described silicon nitride layer and silicon oxide layer are mixed, only the silicon nitride layer may be selectively etched with respect to the silicon oxide layer, the etch rate may be fast, and the abnormal growth may not be generated in the layer other than the silicon nitride layer after etching, thus minimizing defects in manufacturing the semiconductor device.

Further, the silicon nitride layer etching composition according to embodiments of the present invention has high temperature stability, thereby effectively suppressing or minimize possibilities that the silicon oxide layer is etched by the phosphoric acid heated at a high temperature. Therefore, the abnormal growth of the silicon oxide layer may not be generated, thereby preventing substrate defects, and the silicon nitride layer may be selectively etched to implement excellent semiconductor device characteristics.

The method of selectively etching the silicon nitride layer relative to the silicon oxide layer using the above-described silicon nitride layer etching composition and the method of suppressing the abnormal growth of the silicon oxide layer may be performed according to a method commonly used in the art.

For example, the method may be performed by an immersion method, a spray method, or the like.

For example, the method may be performed at a process temperature of 100° C. or more, specifically, at a process temperature of 100 to 500° C., and more specifically, 100 to 300° C.

When the silicon oxide layer, the silicon nitride layer, the photoresist layer, and the like, formed on the substrate are mixed, the above method may selectively etch only the silicon nitride layer quickly with respect to the silicon oxide layer, may suppress the generation of precipitates, and may reduce the abnormal growth of the layer other than the silicon nitride layer.

The substrate may be formed of various materials such as silicon, quartz, glass, silicon wafer, polymer, metal, and metal oxide, and the like, but the material of the substrate is not limited thereto. As an example of the polymer substrate, a film substrate such as polyethylene terephthalate, polycarbonate, polyimide, polyethylene naphthalate, cycloolefin polymer, or the like, may be used, but the substrate is not limited thereto.

The silicon oxide layer, the silicon nitride layer, and the photoresist layer may each be formed of a single layer, a double layer, or multiple layers (multilayer). When the silicon oxide layer, the silicon nitride layer, or the photoresist layer is the double layer or the multiple layers, the stacking order is not limited.

The method of manufacturing a semiconductor device including an etching process selectively etching a silicon nitride layer using the above-described silicon nitride layer etching composition may also be performed according to a method commonly used in the art.

According to the method of manufacturing a semiconductor device, it is possible to selectively etch the silicon nitride layer in the semiconductor device in which the silicon nitride layer and the silicon oxide layer are alternately stacked or mixed, to effectively suppress damage to the silicon oxide layer, thereby minimizing damage to the silicon oxide layer by etching, and thus it is possible to greatly improve stability, efficiency and reliability of the semiconductor device manufacturing process. Here, the kind of the semiconductor device is not particularly limited in the present invention.

Therefore, the method according to embodiments of the present invention may selectively remove the silicon nitride layer relative to the silicon oxide layer, and may maintain the etch rate and the etch selectivity ratio to be constant despite the increase in treatment time, and thus the method according to embodiments of the present invention may be efficiently applied to processes requiring selective etching of the silicon nitride layer. In particular, the method according to embodiments of the present invention may have an excellent effect of suppressing the generation of precipitates and reducing the abnormal growth of other layers existing in the vicinity, including the silicon oxide layer, thereby securing process stability and reliability.

Hereinafter, Examples and Comparative Examples of the present invention are described in more detail. Meanwhile, the following Examples and Comparative Examples are provided by way of example for explaining the present invention in more detail, and therefore, the present invention is not limited thereto. Unless otherwise stated in the present disclosure, all of the temperatures are expressed in the unit of ° C., and the amount of composition used is expressed in the unit of wt %.

(Evaluation Method)

1) Measurement of Etch Rate

Specifically, a silicon nitride layer (SiN layer) wafer and a silicon oxide layer wafer were respectively prepared in the same manner as in the semiconductor manufacturing process by chemical vapor deposition (CVD). As the silicon oxide layer wafer, a plasma enhanced tetra ethyl ortho silicate (PETEOS) layer was used.

A thickness of the composition before etching was measured using an Ellipsometer (M-2000U manufactured by J. A WOOLLAM) as a thin layer thickness measuring apparatus. The wafer was immersed in a composition maintained at an etch temperature of 163° C. in a quartz bath for 10 minutes to conduct the etching process. After the etching was completed, the composition was cleaned with ultrapure water, then the residual etchant and moisture were thoroughly dried using a drying apparatus, and the etch rate was measured.

The etch rate was calculated by dividing a difference between a thickness before etching and a thickness after etching using the Ellipsometer (M-2000U manufactured by JA WOOLLAM) by the etch time (minute).

2) Measurement of Etch Rate Drift

The silicon nitride layer etch rate of the composition was measured by the etch rate measurement method.

The etch rate drift ($\Delta ERD_{SiNx}$) was measured by performing etching on 10 batches, i.e., by repeating this etching process (defined as 1 batch) 10 times without changing the silicon nitride layer etching composition.

The etch rate drift ($\Delta ERD_{SiNx}$ (%)) was calculated by Equation 1 below. Here, the following initial etch rate is an etch rate at the time of performing the etching process once.

$$\Delta ERD(\%) = [1 - \{(\text{etch rate when etching process is repeated n times or more})/(\text{initial etch rate})\}] \times 100 \quad \text{[Equation 1]}$$

3) Measurement of Generation Level (Å) of Oxide Layer Abnormal Growth

A difference between the thickness before etching and the thickness after etching of the composition was measured using an Ellipsometer (M-2000U manufactured by J. A WOOLLAM) as a thin layer thickness measuring apparatus. Here, the difference in thickness between thin layers before and after etching was evaluated as an abnormal growth thickness.

Examples 1 to 9 and Comparative Examples 1 to 8

Each silicon nitride layer etching composition was prepared by mixing components at composition ratios shown in Table 1, and stirring prepared mixtures at a rate of 500 rpm for 5 minutes at room temperature. An amount of water was determined as a residual amount so that the total weight of the composition was 100 wt %.

TABLE 1

| | Phosphoric acid (wt %) | First silicon-based compound Component | First silicon-based compound Amount (wt %) | Second silicon-based compound Component | Second silicon-based compound Amount (wt %) | Additive Component | Additive Amount (wt %) | Water (residual amount) |
|---|---|---|---|---|---|---|---|---|
| Example 1 | 85 | A-1 | 0.5 | B-1 | 0.05 | — | — | 14.45 |
| Example 2 | 85 | A-1 | 1 | B-1 | 0.1 | — | — | 13.9 |
| Example 3 | 85 | A-1 | 1 | B-1 | 0.15 | C-1 | 0.03 | 13.82 |
| Example 4 | 85 | A-2 | 0.5 | B-1 | 0.05 | — | — | 14.45 |
| Example 5 | 85 | A-3 | 0.5 | B-1 | 0.05 | — | — | 14.45 |
| Example 6 | 85 | A-4 | 0.5 | B-1 | 0.05 | — | — | 14.45 |
| Example 7 | 85 | A-1 | 0.5 | B-2 | 0.05 | — | — | 14.45 |
| Example 8 | 85 | A-1 | 0.5 | B-3 | 0.05 | — | — | 14.45 |
| Example 9 | 85 | A-1 | 0.5 | B-4 | 0.05 | — | — | 14.45 |
| Comparative Example 1 | 85 | A-1 | 0.5 | — | — | — | — | 14.5 |
| Comparative | 85 | A-1 | 0.5 | — | — | TEOS | 0.05 | 14.45 |

TABLE 1-continued

|  | Phosphoric acid (wt %) | First silicon-based compound Component | First silicon-based compound Amount (wt %) | Second silicon-based compount Component | Second silicon-based compount Amount (wt %) | Additive Component | Additive Amount (wt %) | Water (residual amount) |
|---|---|---|---|---|---|---|---|---|
| Comparative Example 2 | | | | | | | | |
| Comparative Example 3 | 85 | A-3 | 0.5 | — | — | — | — | 14.5 |
| Comparative Example 4 | 85 | A-4 | 0.5 | — | — | — | — | 14.5 |
| Comparative Example 5 | 85 | — | — | B-1 | 0.05 | TEOS | 0.05 | 14.9 |
| Comparative Example 6 | 85 | — | — | B-2 | 0.05 | — | — | 14.95 |
| Comparative Example 7 | 85 | — | — | B-3 | 0.05 | — | — | 14.95 |
| Comparative Example 8 | 85 | — | — | B-4 | 0.05 | — | — | 14.95 |

A-1: (3-aminopropyl)silanetriol
A-2: N-(2-aminoethyl)-(3-aminopropyl)trimethoxysilane
A-3: 4-amino-3,3-dimethylbutyltrimethoxysilane
A-4: (N,N-dimethyl-3-aminopropyl)trimethoxysilane
B-1: 3-(trihydroxysilyl)-1-propanesulfonic acid
B-2: 3-(trihydroxysilyl)propyl methylphosphonate monosodium salt
B-3: diethylphosphatoethyltriethoxysilane
B-4: [2-(trihydroxysilyl)ethyl]phosphonic acid
C-1: ammonium fluoride
TEOS: tetraethylorthosilicate

TABLE 2

|  | Etch rate (Å/min) Nitride layer ($E_{SiNx}$) | Etch rate (Å/min) Oxide layer ($E_{SiO2}$) | Selectivity ratio ($E_{SiNx}/E_{SiO2}$) |
|---|---|---|---|
| Example 1 | 161.2 | 0.09 | 1791 |
| Example 2 | 162.1 | 0.05 | 3242 |
| Example 3 | 172.3 | 0.07 | 2461 |
| Example 4 | 158.8 | 0.09 | 1764 |
| Example 5 | 159.7 | 0.08 | 1996 |
| Example 6 | 163.5 | 0.08 | 2044 |
| Example 7 | 162.4 | 0.10 | 1624 |
| Example 8 | 161.6 | 0.08 | 2020 |
| Example 9 | 159.6 | 0.09 | 1773 |
| Comparative Example 1 | 160.2 | 0.42 | 381 |
| Comparative Example 2 | 158.4 | 0.48 | 330 |
| Comparative Example 3 | 159.7 | 0.51 | 313 |
| Comparative Example 4 | 161.1 | 0.46 | 350 |
| Comparative Example 5 | 160.1 | 0.33 | 485 |
| Comparative Example 6 | 158.6 | 0.35 | 453 |
| Comparative Example 7 | 157.5 | 0.37 | 426 |
| Comparative Example 8 | 162.2 | 0.34 | 477 |

TABLE 3

|  | Number of batches | Nitride layer etch rate (Å/min) | Nitride layer etch rate drift (%) | Generation level (Å) of oxide layer abnormal growth |
|---|---|---|---|---|
| Example 1 | 1 | 161.2 | — | 0 |
|  | 10 | 160.2 | 0.62 | 0 |
| Example 2 | 1 | 162.1 | — | 0 |
|  | 10 | 161.4 | 0.43 | 0 |
| Example 3 | 1 | 172.3 | — | 0 |
|  | 10 | 171.9 | 0.23 | 0 |
| Example 4 | 1 | 158.8 | — | 0 |
|  | 10 | 157.5 | 0.82 | 0 |
| Example 5 | 1 | 159.7 | — | 0 |
|  | 10 | 158.8 | 0.56 | 0 |
| Example 6 | 1 | 163.5 | — | 0 |
|  | 10 | 162.1 | 0.86 | 0 |
| Example 7 | 1 | 162.4 | — | 0 |
|  | 10 | 161.7 | 0.43 | 0 |
| Example 8 | 1 | 161.6 | — | 0 |
|  | 10 | 160.8 | 0.50 | 0 |
| Example 9 | 1 | 159.6 | — | 0 |
|  | 10 | 159.0 | 0.38 | 0 |
| Comparative Example 1 | 1 | 160.2 | — | 0 |
|  | 10 | 156.2 | 2.50 | 12 |
| Comparative Example 2 | 1 | 158.4 | — | 0 |
|  | 10 | 154.3 | 2.59 | 16 |
| Comparative Example 3 | 1 | 159.7 | — | 0 |
|  | 10 | 155.4 | 2.69 | 13 |
| Comparative Example 4 | 1 | 161.1 | — | 0 |
|  | 10 | 156.6 | 2.79 | 17 |
| Comparative Example 5 | 1 | 160.1 | — | 0 |
|  | 10 | 151.3 | 5.50 | 33 |
| Comparative Example 6 | 1 | 158.6 | — | 0 |
|  | 10 | 149.1 | 5.99 | 37 |
| Comparative Example 7 | 1 | 157.5 | — | 0 |
|  | 10 | 148.7 | 5.59 | 35 |
| Comparative Example 8 | 1 | 162.2 | — | 0 |
|  | 10 | 152.7 | 5.86 | 42 |

As shown in Tables 2 and 3, in each of the silicon nitride layer etching compositions according to embodiments of the present invention, the etch selectivity ratio was all excellent as 1000 or more. In addition, it was confirmed that etch rate drift with respect to the silicon nitride layer was remarkably low even though the silicon nitride layer etching composition was reused several times by repeating the etching process. In particular, it was noted that in all cases of the silicon nitride layer etching composition according to embodiments of the present invention, the abnormal growth of the silicon nitride layer was not generated at all even though the etching process was repeatedly performed.

Specifically, it was confirmed that in the case of adopting the first silicon-based compound as in Example 2 in the silicon nitride layer etching composition according to embodiments of the present invention, the remarkably improved etch selectivity ratio could be implemented.

Specifically, it was confirmed that when the first silicon-based compound and the phosphorus (P)-containing second silicon-based compound were simultaneously included in the silicon nitride layer etching composition according to embodiments of the present invention, the silicon nitride layer etch rate drift was more excellent.

On the other hand, in each of the silicon nitride layer etching compositions of Comparative Examples 1 to 8, the etch selectivity ratio was less than 500, which was significantly lower than those of Examples of the present invention. In addition, in all Comparative Examples, the generation of abnormal growth of the silicon nitride layer could not be suppressed when the etching process was repeated.

In short, according to embodiments of the present invention, not only the silicon nitride layer may be selectively etched with an excellent etch selectivity ratio, but also the etch rate drift is low even when the silicon nitride layer is used several times, thus maintaining the initial etching performance to remarkably increase the production efficiency. In addition, it is possible to minimize damage on the layer quality of the silicon oxide layer during the etching process and to effectively suppress the abnormal growth of the silicon oxide layer, thereby providing a high-quality semiconductor device.

The silicon nitride layer etching composition according to embodiments of the present invention may selectively etch the silicon nitride layer relative to the silicon oxide layer, and may have a remarkably excellent etch selectivity ratio.

In addition, the silicon nitride layer etching composition according to embodiments of the present invention has a small change in etch rate and a small change in etch selectivity ratio with respect to the silicon nitride layer even when an etching treatment time increases or the etching composition is repeatedly used. Thus, ultimately, the productivity in the semiconductor manufacturing process for selectively etching the silicon nitride layer may be improved.

Further, the silicon nitride layer etching composition according to embodiments of the present invention may have excellent storage stability and may maintain a constant etch rate and etch selectivity ratio with respect to the silicon nitride layer even though silicon nitride layer etching composition is used or stored for a long period of time.

Further, when the silicon nitride layer etching composition according to embodiments of the present invention is used in an etching process and a semiconductor manufacturing process, there are remarkable effects of suppressing the generation of precipitates and reducing the abnormal growth of other layers existing in the vicinity, including the silicon oxide layer.

It will be apparent to those skilled in the art that the present invention is not limited to the above-described embodiments, and various substitutions, changes, and alterations can be made without departing from the technical idea of the present invention.

What is claimed is:

1. A silicon nitride layer etching composition comprising: a phosphoric acid, a first silicon-based compound represented by Chemical Formula 1 below, a second silicon-based compound represented by Chemical Formula 2 below, a fluorine-based compound and water:

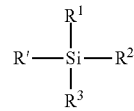

[Chemical Formula 1]

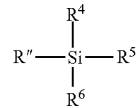

[Chemical Formula 2]

wherein $R^1$ to $R^6$ are each independently selected from the group consisting of hydrogen, a halogen, hydroxy, (C1-C10)alkoxy, (C1-C10)alkyl, and (C2-C10)alkenyl;

wherein R' is amino(C1-C10)alkyl, wherein —$CH_2$— of the amino(C1-C10)alkyl is optionally substituted with —N($R^{11}$)— or —O—, wherein $R^{11}$ is hydrogen, (C1-C10)alkyl, or amino(C1-C10)alkyl;

wherein R" is selected from the group consisting of —$L_1$—$SO_3$H, —$L_2$—OP(=O)(OH)$_2$, —$L_3$—P(=O)(O$R^{12}$)(O$R^{13}$), —$L_4$—OP(=O)(OH)($R^{14}$), —$L_5$—P(=O)(O$R^{15}$)$R^{16}$, and a salt thereof, wherein $L_1$ to $L_5$ are each independently (C1-C10)alkylene or (C3-C10) cycloalkylene, and $R^{12}$ to $R^{16}$ are each independently hydrogen or (C1-C10)alkyl; and wherein the R' and R" are unsubstituted or substituted with one or more selected from the group consisting of halogen, hydroxy, cyano, nitro, (C1-C10)alkyl, (C1-C10)alkoxy, (C3-C10) cycloalkyl, (C3-C10)heterocycloalkyl, (C3-C12)heteroaryl, and (C6-C12)aryl, wherein the heterocycloalkyl or the heteroaryl includes one or more selected from the group consisting of B, N, O, S, P(=O), Si, and P.

2. The silicon nitride layer etching composition of claim 1, wherein a molar ratio of the first silicon-based compound and the second silicon-based compound is 1:0.01 to 1:1.

3. The silicon nitride layer etching composition of claim 1, wherein the silicon nitride layer etching composition includes the first silicon-based compound and the second silicon-based compound in a weight ratio of 1:1 to 100:1.

4. The silicon nitride layer etching composition of claim 1, wherein an etch rate with respect to a silicon nitride layer of the silicon nitride layer etching composition is 100 to 300 Å/min, and an etch rate with respect to a silicon oxide layer of the silicon nitride layer etching composition is 0 to 0.2 Å/min.

5. The silicon nitride layer etching composition of claim 1, wherein a silicon nitride layer / silicon oxide layer etch selectivity ratio of the silicon nitride layer etching composition is 500 or more.

6. The silicon nitride layer etching composition of claim 1, wherein an etch rate drift of a silicon nitride layer after repeating an etching process satisfies Relational Expression 1 below:

$$\Delta ERD_{SiNx} \leq 1\%$$ [Relational Expression 1]

in Relational Expression 1,
wherein $\Delta ERD_{SiNx}$ is an etch rate drift relative to an initial etch rate with respect to the silicon nitride layer.

7. A method of selectively etching a silicon nitride layer relative to a silicon oxide layer using the silicon nitride layer etching composition of claim 1.

8. A method of manufacturing a semiconductor device comprising:
  selectively etching a silicon nitride layer relative to a silicon oxide layer using the silicon nitride layer etching composition of claim 1.

* * * * *

UNITED STATES PATENT AND TRADEMARK OFFICE
CERTIFICATE OF CORRECTION

| | |
|---|---|
| PATENT NO. | : 11,149,201 B2 |
| APPLICATION NO. | : 16/416089 |
| DATED | : October 19, 2021 |
| INVENTOR(S) | : Dong Hyun Kim |

It is certified that error appears in the above-identified patent and that said Letters Patent is hereby corrected as shown below:

In the Specification

In Column 1, Line 37 (approx.), delete "to to" and insert -- to --.

In Column 2, Line 52, delete "Li" and insert -- $L_1$ --.

In Column 3, Line 5, delete "$R^1$" and insert -- $R^{11}$ --.

In Column 3, Line 7, delete "Li" and insert -- $L_1$ --.

In Column 7, Line 52, delete "$L_1$" and insert -- $L_{11}$ --.

In Column 8, Line 47 (approx.), delete "(OH) 2," and insert -- $(OH)_2$, --.

In Column 12, Line 4, delete "boro silicate" and insert -- borosilicate --.

In Columns 13-14, TABLE 1, Line 2, delete "compount" and insert -- compound --.

In Columns 15-16, TABLE 1-continued, Line 2, delete "compount" and insert -- compound --.

In the Claims

In Column 18, Line 62 (approx.), Claim 6, below "$\Delta ERD_{SiNx} \leq 1\%$" delete "in Relational Expression 1,".

Signed and Sealed this
Twenty-sixth Day of April, 2022

Katherine Kelly Vidal
*Director of the United States Patent and Trademark Office*